United States Patent
Kim et al.

(10) Patent No.: US 9,461,227 B2
(45) Date of Patent: Oct. 4, 2016

(54) THERMOELECTRIC MATERIAL INCLUDING NANO-INCLUSIONS, THERMOELECTRIC MODULE AND THERMOELECTRIC APPARATUS INCLUDING THE SAME

(71) Applicant: SAMSUNG ELECTRONICS CO., LTD., Suwon-si, Gyeonggi-do (KR)

(72) Inventors: Sang-il Kim, Seoul (KR); Kyu-hyoung Lee, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 135 days.

(21) Appl. No.: 14/585,661

(22) Filed: Dec. 30, 2014

(65) Prior Publication Data

US 2015/0114441 A1    Apr. 30, 2015

Related U.S. Application Data

(63) Continuation of application No. 13/355,883, filed on Jan. 23, 2012, now Pat. No. 8,957,299.

(30) Foreign Application Priority Data

Jan. 24, 2011   (KR) ........................ 10-2011-0006836
Nov. 28, 2011   (KR) ........................ 10-2011-0125220

(51) Int. Cl.
| | | |
|---|---|---|
| H01L 35/28 | (2006.01) | |
| H01L 35/16 | (2006.01) | |
| H01B 1/06 | (2006.01) | |
| B82Y 30/00 | (2011.01) | |
| B82Y 40/00 | (2011.01) | |

(Continued)

(52) U.S. Cl.
CPC ............... *H01L 35/16* (2013.01); *B82Y 30/00* (2013.01); *B82Y 40/00* (2013.01); *H01B 1/06* (2013.01); *H01L 35/18* (2013.01); *H01L 35/26* (2013.01); *Y10T 428/25* (2015.01)

(58) Field of Classification Search
CPC ....... H01L 35/12; H01L 35/14; H01L 35/16; H01L 35/18; H01L 35/26
See application file for complete search history.

(56) References Cited

U.S. PATENT DOCUMENTS

| | | | |
|---|---|---|---|
| 6,225,548 B1 * | 5/2001 | Sakakibara et al. | |
| 6,605,772 B2 * | 8/2003 | Harman et al. | |
| 2002/0092557 A1 * | 7/2002 | Ghoshal | |

(Continued)

FOREIGN PATENT DOCUMENTS

| | | | |
|---|---|---|---|
| GB | 907901 | 1/1961 | |
| GB | 907901 A * | 10/1962 | ............. H01L 35/16 |

(Continued)

OTHER PUBLICATIONS

L.D. Hicks et al., "Use of quantum-well superlattices to obtain a high figure of merit from nonconventional thermoelectric materials", Appl. Phys. Lett. vol. 63, No. 23, Dec. 6, 1993, pp. 3230-3232.

(Continued)

*Primary Examiner* — Eli Mekhlin
(74) *Attorney, Agent, or Firm* — Cantor Colburn LLP

(57) ABSTRACT

A thermoelectric material including a thermoelectric matrix; and nano-inclusions in the thermoelectric matrix, the nano-inclusions having an average particle diameter of about 10 nanometers to about 30 nanometers.

11 Claims, 13 Drawing Sheets

(51) Int. Cl.
*H01L 35/26* (2006.01)
*H01L 35/18* (2006.01)

(56) References Cited

U.S. PATENT DOCUMENTS

| | | | |
|---|---|---|---|
| 2004/0253536 A1* | 12/2004 | Park et al. | |
| 2005/0045702 A1* | 3/2005 | Freeman et al. | |
| 2006/0102224 A1* | 5/2006 | Chen et al. | |
| 2007/0028956 A1 | 2/2007 | Venkatasubramanian et al. | |
| 2009/0203196 A1 | 8/2009 | Kim et al. | |
| 2009/0205696 A1 | 8/2009 | Koester et al. | |
| 2010/0108115 A1* | 5/2010 | Lee | H01L 35/26 136/236.1 |
| 2012/0090656 A1* | 4/2012 | Snyder | H01L 35/26 136/201 |

FOREIGN PATENT DOCUMENTS

| | | | | |
|---|---|---|---|---|
| JP | 2000-164940 A | 6/2000 | | |
| JP | 2009-194085 A | 8/2009 | | |
| KR | 1020070108853 A | 11/2007 | | |
| WO | 2008140596 A2 | 11/2008 | | |
| WO | 2010041146 A2 | 4/2010 | | |
| WO | 2010080279 A2 | 7/2010 | | |
| WO | WO 2010080279 A2 * | 7/2010 | | C04B 35/457 |

OTHER PUBLICATIONS

Sang Il Kim et al., "Enhancement of Seebeck Coefficient in Bi0.5Sb1.5Te3 with High-Density Tellurium Nanoinclusions", Applied Physics Express 4 (Sep. 7, 2011), pp. 091801-1-091801-3.

Sergey V. Faleev et al., "Theory of enhancement of thermoelectric properties of materials with nanoinclusions", Physical Review, B 77, 2008, pp. 214304-1-214304-9.

Slack, "New Materials and Performance Llmits for Thermoelectric Cooling", Thermoelectric Materials, 1995, pp. 409-421.

T. Caillat et al, "Thermoelectric Properties of (Bix Sb1-x)2 Te3 Single Crystal Solid Solutions Grown by the T.H.M. Method", J. Phys. Chem. Solids, vol. 53, No. 8, 1992, pp. 1121-1129.

* cited by examiner

PRIOR ART

PRIOR ART

THERMOELECTRIC MATERIAL INCLUDING NANO-INCLUSIONS, THERMOELECTRIC MODULE AND THERMOELECTRIC APPARATUS INCLUDING THE SAME

CROSS-REFERENCE TO RELATED APPLICATIONS

This application is a continuation of U.S. application Ser. No. 13/355,883, filed on Jan. 23, 2012, which has issued as U.S. Pat. No. 8,957,299, and which claims priority to Korean Patent Application No. 10-2011-0006836, filed on Jan. 24, 2011, and Korean Patent Application No. 10-2011-0125220, filed on Nov. 28, 2011, and all the benefits accruing therefrom under 35 U.S.C. §119, the contents of which in their entirety are herein incorporated by reference.

BACKGROUND

1. Field

The present disclosure relates to a thermoelectric material including nano-inclusions, thermoelectric modules and thermoelectric apparatuses including the same, and more particularly, to thermoelectric materials having improved thermoelectric conversion efficiency.

2. Description of the Related Art

The thermoelectric phenomenon refers to reversible and direct energy conversion between heat and electricity. The thermoelectric phenomenon may be classified as a Peltier effect or a Seebeck effect, wherein the Peltier effect is applied to cooling using a temperature difference between ends of a material generated by an applied current, and the Seebeck effect is applied to power generation using an electromotive force generated by a temperature difference between ends of a material.

The thermoelectric material can be applied to provide an active cooling system for electronic devices, such as semiconductor equipment where heat management problems are difficult to solve using a passive type cooling system. Demand for active cooling is expanding to other fields, for example where heat generating problems cannot be readily solved by gas compression-type cooling systems. Thermoelectric cooling is an environmentally friendly cooling technology with no-vibration and low-noise. Thermoelectric cooling avoids the use of refrigerant gases that may cause environmental problems. The applications of thermoelectric cooling may expand into general-purpose cooling, such as residential or commercial refrigerators or air conditioners if thermoelectric cooling efficiency can improve, e.g., by the development of improved thermoelectric materials. In addition, if thermoelectric materials are applied to locations where heat is released, such as in engines of vehicles or industrial plants, electricity may be generated from what would otherwise be waste heat. Thus, the thermoelectric technology is highlighted as a renewable energy source. Thus there remains a need for improved thermoelectric materials.

SUMMARY

Provided are thermoelectric materials including nano-inclusions, which provide improved thermoelectric conversion efficiency.

Provided are thermoelectric modules including the thermoelectric materials including nano-inclusions.

Provided are thermoelectric devices including the thermoelectric modules.

Additional aspects, features, and advantages will be set forth in part in the description which follows and, in part, will be apparent from the description.

According to an aspect, a thermoelectric material includes a thermoelectric matrix; and nano-inclusions in the thermoelectric matrix, the nano-inclusions having an average particle diameter of about 10 nanometers to about 50 nm.

According to an embodiment, the average particle diameter of the nano-inclusions may be about 10 nm to about 30 nm.

According to an embodiment, a density of the nano-inclusions may be in a range of about 2,400 nano-inclusions per cubic micrometer (ea/$\mu$m$^3$) to about 24,000 ea/$\mu$m$^3$.

According to an embodiment, an average distance between adjacent nano-inclusions may be in a range of about 10 nm to about 80 nm.

According to an embodiment of the present invention, the volume of the nano-inclusions may be about 35 vol % or less based on a total volume of the thermoelectric material.

According to an embodiment, the volume of the nano-inclusions may be in a range of about 1 volume percent (vol %) to about 20 vol %, based on a total volume of the thermoelectric material.

According to an embodiment, a work function of the nano-inclusions may be in a range of about 3.8 electron volts (eV) to about 5.1 eV.

According to an embodiment, the nano-inclusions may include a metal, such as Te, Sb, Fe, Mo, or any combination thereof.

According to an embodiment, the Bi—Te based thermoelectric material may have a composition of the following Formula 1:

$$A_xB_y \qquad \text{Formula 1}$$

wherein A is at least one of Bi and Sb, B is at least one of Te and Se, x is a number in a range of more than 0 and 2 or less, and y is a number in a range of more than 0 and 3 or less.

According to an embodiment, the nano-inclusions may be included between each layer of a layered structure of a Bi—Te type thin film thermoelectric material.

According to an embodiment, the thickness of each layer of the layered structure may be in a range of about 4 nm to about 50 nm.

According to another aspect, disclosed is a thermoelectric thin film material, including: a first layer including a first thermoelectric matrix; a second layer on the first layer, the second layer including nano-inclusions having an average particle diameter in a range of about 10 nanometers to about 30 nanometers; and a third layer on the second layer, the third layer including a second thermoelectric matrix.

Also disclosed is a thermoelectric device including the above disclosed thermoelectric material.

Also disclosed is a thermoelectric device including the above disclosed thermoelectric thin film material.

According to another aspect, a thermoelectric module includes a first electrode, a second electrode, and the above disclosed thermoelectric device including the thermoelectric material disposed between the first electrode and the second electrode.

According to another aspect, disclosed is a thermoelectric module, including: a first electrode; a second electrode; and the above disclosed thermoelectric device including the thermoelectric thin film disposed between the first electrode and the second electrode.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
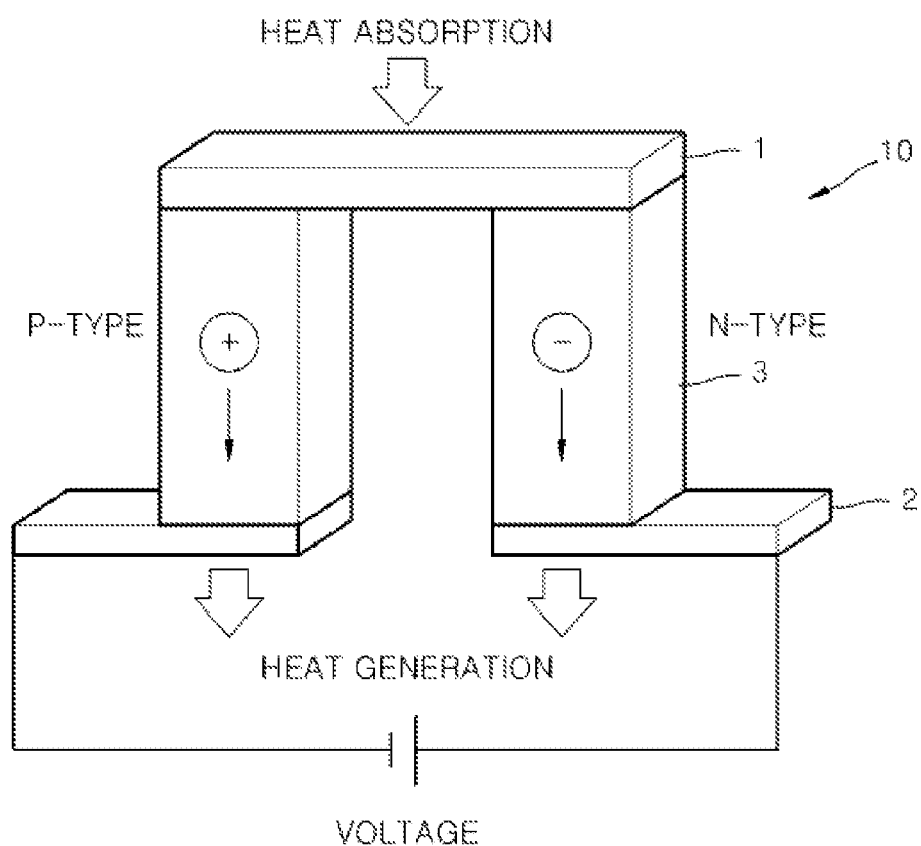
FIG. 1 is a schematic view illustrating thermoelectric cooling by a Peltier effect.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

It will be understood that when an element is referred to as being "on" another element, it can be directly on or within the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A thermoelectric conversion efficiency of a thermoelectric material may be improved by disposing (e.g., inserting) nano-inclusions on (e.g., into) a thermoelectric matrix (e.g., a Bi—Te type thermoelectric matrix) at a high density to cause a carrier energy filtering effect. A carrier energy filtering effect is a quantum confinement effect in a broad sense, and can increase a Seebeck coefficient of the thermoelectric material.

Figure 3:
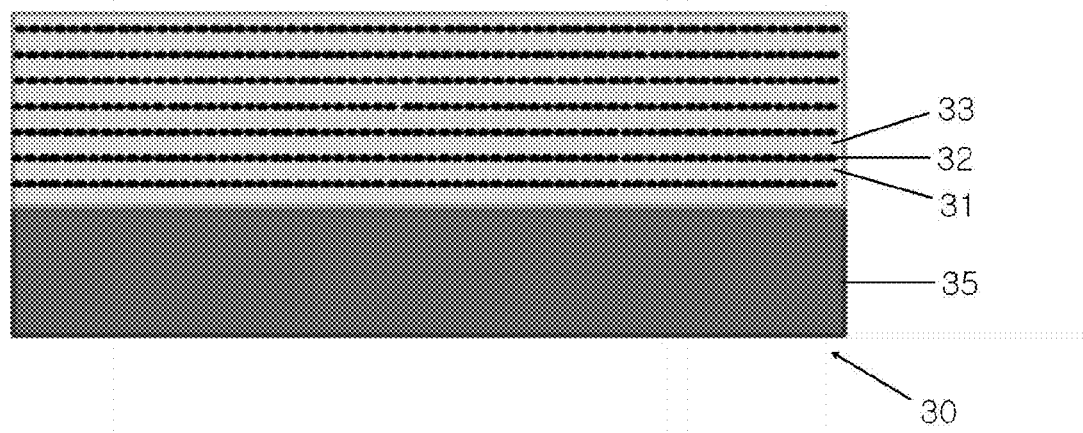
FIG. 3 is a schematic view of an embodiment of a material in which carrier filtering effects may occur.

FIG. 3 is a schematic view of a thermoelectric material 30 which comprises a thermoelectric matrix and nano-inclusions inserted therein. As shown in FIG. 3, it can be seen that a thermoelectric material may have a layered shape and nano-inclusions may be distributed (e.g., uniformly distributed) in a layer which is between layers of the thermoelectric matrix. Also, the thermoelectric material 30 may be disposed (e.g., formed) on a substrate 35.

When the performance of a thermoelectric material is evaluated, a ZT value according to the following Mathematical Formula 1, commonly known as a dimensionless figure of merit, is used.

$$ZT=(S^2\sigma T)/k \qquad \text{Mathematical Formula 1}$$

In Mathematical Formula 1, Z is a figure of merit, S is a Seebeck coefficient, σ is an electrical conductivity, T is absolute temperature, and k is a thermal conductivity.

As shown in Mathematical Formula 1, the Seebeck coefficient and the electrical conductivity, that is, a power factor ($S^2\sigma$), is desirably increased in order to increase a ZT value of a thermoelectric material. However, and while not wanting to be bound by theory, the Seebeck coefficient and the electrical conductivity are understood to have a trade-off relationship, when one of the values is decreased the other is increased due to variations in a concentration of electron or hole carriers, and thus there are significant (e.g., physical) limitations to increasing the power factor.

Using nano-structuring technology, superlattice thin films, nanowires, and quantum dots, may be fabricated. Using quantum confinement effects, a Seebeck coefficient of Be—Te type materials may be increased or their thermal conductivity may be decreased using a Phonon Glass Electron Crystal ("PGEC") concept to provide a very high thermoelectric performance.

The quantum confinement effect can increase the carrier density in a material to increase an effective mass of the carriers, thereby increasing a Seebeck coefficient without significantly changing the electrical conductivity. Use of the quantum confinement effect can thus collapse the trade-off relationship between electrical conductivity and Seebeck coefficient suggested by Mathematical Formula 1. The PGEC suggests blocking the movement of phonons, which are responsible for heat transfer, and not inhibiting the movement of carriers, e.g., electrons, to lower the thermal conductivity while maintaining electrical conductivity.

According to an aspect, and while not wanting to be bound by theory, a thermoelectric conversion efficiency of a thermoelectric material may be improved by disposing (e.g., inserting) nano-inclusions to cause a carrier energy filtering effect, which is one type of quantum confinement effect in a broad sense, to increase a Seebeck coefficient of the thermoelectric material.

The carrier energy filtering effect is understood to decrease an effective carrier density in a material. The carrier energy filtering effect can occur when a heterogeneous material is included in the thermoelectric material to inhibit the movement of carriers with a specific energy (Carrier Energy Filtering). The movement of the carriers is understood to be inhibited at an interface of the thermoelectric material and the nano-inclusion, and is understood to increase the carrier relaxation time to enhance a Seebeck coefficient of the thermoelectric material.

In an embodiment, and while not wanting to be bound by theory, nano-inclusions are inserted into a thermoelectric material to generate an energy-dependent scattering of carriers at the interface of the thermoelectric material and the heterogeneous inclusion due to a difference in electrostatic potential of the two materials. Also, scattering of low-energy carriers increases a carrier relaxation time. At this time, the Seebeck coefficient is proportional to an energy derivative term of a carrier dwell time at Fermi energy level, and thus has an increased value. The carrier dwell time is increased more than an increased value of the Seebeck coefficient as the number of carriers decreases.

As a result, a decrease in the electrical conductivity from the carrier energy filtering effect is relatively small, a power factor of a thermoelectric material may be increased in a region where the increase in the Seebeck coefficient frequently occurs, and the ZT value, which is a thermoelectric conversion efficiency index, may be increased.

As these effects are understood to occur at the interface between the thermoelectric matrix and the heterogeneous material, the carrier energy filtering effect is increased according to the number of interfaces, and the number of interfaces increases as the volume ratio of inserted inclusions increases and as the size of the inserted inclusions decreases. Thus it is desirable to increase the number of interfaces to improve the power factor (electrical conductivity×(Seebeck coefficient)²).

In an embodiment, a thermoelectric material including nano-inclusions may be formed by alternate deposition of a layer comprising the thermoelectric matrix and a nano-particle layer. The nano-inclusions may be disposed on and in contact with the thermoelectric matrix.

Also, nano particles inserted into the thermoelectric matrix play an important role in creating a carrier energy filtering effect. In the thermoelectric material including nano-inclusions, an increase of a Seebeck coefficient is greater than a decrease of an electrical conductivity, and consequently an increase in a power factor may be obtained. The increased power factor directly means an increase in ZT. According to an aspect, a Bi—Te type thermoelectric material may be used as a thermoelectric matrix into which the nano-inclusions are inserted, and a material having a composition of the following Formula 1 may be used.

$$A_xB_y \qquad \text{Formula 1}$$

In Formula 1, A is at least one of Bi and Sb, B is at least one of Te and Se, x is a number in a range of more than 0 and less than about 2, and y is a number in a range of more than 0 and less than about 3. In an embodiment, x is in a range of about 0.1 to about 1.5, specifically about 0.5 to about 1, and y is in a range of about 0.1 to about 2.5, specifically about 0.5 to about 2. The thermoelectric matrix $Bi_{0.5}Sb_{1.5}Te_3$ is specifically mentioned.

The thermoelectric material of the Formula 1 may include a thermoelectric material of the following Formula 2.

$$(Bi_2Sb_{2-a})(Te_3Se_{3-b}) \qquad \text{Formula 2}$$

In Formula 2 a is a number in a range of more than 0 and less than about 2 and b is a number in a range of more than 0 and less than about 3. In an embodiment, a is in a range of about 0.1 to about 1.5, specifically about 0.5 to about 1, and b is in a range of about 0.1 to about 2.5, specifically about 0.5 to about 2.

According to an aspect, nano-inclusions, which may be disposed in the Bi—Te type thermoelectric matrix, may have a nano-scale size and may be in the form of a particulate material. The nano-inclusions may have an average particle diameter (e.g., average largest particle diameter) of less than 50 nanometers, specifically about 1 to about 40 nanometers, more specifically about 10 nanometers to about 30 nanometers. The density of the nano-inclusions may be in a range of about 2,400 nano-inclusions per cubic micrometer (ea/$\mu m^3$) to about 24,000 ea/$\mu m^3$, specifically about 3,000 ea/$\mu m^3$ to about 20,000 ea/$\mu m^3$, more specifically about 4,000 ea/$\mu m^3$ to about 15,000 ea/$\mu m^3$, and thus the average distance between adjacent nano-inclusions may be in a range of about 10 nanometers (nm) to about 80 nm, specifically about 15 nm to about 70 nm, more specifically about 20 nm to about 60 nm. The planar density of the nano-inclusions may be in a range of about 40 nano-inclusions per square micrometer (ea/$\mu m^2$) to about 500 ea/$\mu m^2$, specifically about 50 ea/$\mu m^2$ to about 450 ea/$\mu m^2$, more specifically about 60 ea/$\mu m^2$ to about 400 ea/$\mu m^2$.

The nano-inclusions may be in the form of particles in the thermoelectric matrix, and may have a volume of about 35 volume percent (vol %) or less, specifically about 1 vol % to about 30 vol %, more specifically about 2 vol % to about 25 vol %, based on a total volume of the thermoelectric material thus-obtained. An embodiment wherein the nano-inclusions are present in the thermoelectric material in an amount of about 1 vol % to about 20 vol % is specifically mentioned. The average particle diameter, density, average distance, and volume ratio of the nano-inclusions may be measured from electron microscope analysis (SEM/TEM) of a thin section, the details of which can be determined by one of skill in the art without undue experimentation.

The nano-inclusions may comprise a metal having a selected work function. The work function of the metal of the nano-inclusions may be in a range of, for example, about 3.8 electron volts (eV) to about 5.1 eV, specifically about 4 eV to about 5 eV, more specifically about 4.2 eV to about 4.9 eV. The metal may be selected to select a difference of about 0.1 eV to about 1.0 eV between the electron affinity of the metal and the thermoelectric material, e.g., $Bi_2Te_3$, which has an electron affinity of about 4.1 eV to about 4.5 eV, or $Bi_2Se_3$, which has an electron affinity of about 3.7 eV to about 4.2 eV. While not wanting to be bound by theory, it is understood that the energy-dependent scattering of carriers occurs at the interface of the thermoelectric matrix and the nano-inclusion due to their different electrostatic potentials, and scattering of low-energy carriers may increase a carrier dwell time provide a carrier energy filtering effect. Metals which satisfy these conditions may be Te, Sb, Fe, Mo, Au, Cu, or Ag. In an embodiment, the metal may comprise at least one of Te, Sb, Fe, Mo, Au, Cu, or Ag. In an embodiment, the foregoing may be used alone or in combination as the nano-inclusions. An embodiment wherein the nano-inclusions are Te particles is specifically mentioned.

In an embodiment, the nano-inclusions are in the form of particles inserted into the thermoelectric matrix at a selected density. The nano-inclusions may have a particle size (e.g., an average largest particle size) of about 50 nanometers, specifically about 1 to about 40 nanometers, more specifically about 10 nm to about 30 nm. The nano-inclusions may have an average distance between adjacent particles of about 100 nm or less, for example, about 10 nm to about 80 nm, specifically about 15 nm to about 70 nm, more specifically about 20 nm to about 60 nm, and thus a material with a suitably high density may be formed. As described above, the density of the nano-inclusions may be in a range of about 2,400 ea/$\mu m^3$ to about 24,000 ea/$\mu m^3$, specifically about 3,000 ea/$\mu m^3$ to about 20,000 ea/$\mu m^3$, more specifically about 4,000 ea/$\mu m^3$ to about 15,000 ea/$\mu m^3$.

The nano-inclusions may have a structure in which the nano-inclusions are inserted into the thermoelectric matrix at a high density, and may have a form in which the thermoelectric matrix forms a layered structure and the nano-inclusions are inserted between the layers of the thermoelectric matrix.

In the layered structure, a unit structure including a single-layer of the thermoelectric matrix and a single-layer of the nano-inclusions may have a total thickness in a range of about 4 nm to about 50 nm, specifically about 6 nm to about 45 nm, more specifically about 8 nm to about 40 nm. The nano-inclusions may be disposed (e.g., deposited) using an appropriately selected flux of the metal of the nano-inclusions to form the nano-inclusions on a surface of the thermoelectric matrix during the formation of the thermoelectric material. That is, when a predetermined flux of the nano-inclusions is deposited, the nano-inclusions may be disposed in the form of particles. Thus, the nano-inclusions may be effectively inserted between layers of the thermoelectric matrix by forming a layer of the thermoelectric matrix, forming the nano-inclusions on the layer of the thermoelectric matrix, and then repeating the process.

Because the nano-inclusions are disposed in the form of particles between the layers of the thermoelectric matrix, the nano-inclusions may be formed at a suitably high density and in a range where a solid film of the nano-inclusions is not formed. For example, the average distance between adjacent particles of the nano-inclusions may be about 100 nm or less, for example, about 10 nm to about 80 nm, specifically about 15 nm to about 70 nm, more specifically about 20 nm to about 60 nm. When a total thickness of a single-layer of the thermoelectric matrix and a single-layer of the nano-inclusions is about 4 nm to about 50 nm, an average distance between adjacent nano-inclusions may be, for example, about 10 nm to about 80 nm, specifically about 15 nm to about 70 nm, more specifically about 20 nm to about 60 nm.

When the nano-inclusions have a layered structure, the layer comprising the nano-inclusions may have a thickness in a range of about 0.1 nm to about 2 nm, for example, about 0.1 nm to about 1 nm, specifically about 0.2 nm to about 0.9 nm.

Referring to FIG. 3, the thermoelectric material may comprise a first layer 31 comprising a first thermoelectric matrix, a second layer 32 disposed on the first layer, the second layer comprising nano-inclusions, and a third layer 33 disposed on the second layer, the third layer comprising a second thermoelectric matrix. The first thermoelectric matrix and the second thermoelectric matrix may be the same or different, and may each independently comprise a material of Formula 1 as disclosed above. In an embodiment the first thermoelectric matrix is the same as the second thermoelectric matrix. An embodiment wherein the first layer 31 and the third layer 33 consist of $Bi_{0.5}Sb_{1.5}Te_3$ is specifically mentioned.

The nano-inclusions of the second layer may comprise a metal, and may comprise at least one of Te, Sb, Fe, Mo, Au, Cu, or Ag, as is further disclosed above. An embodiment wherein the nano-inclusions (i.e., the second layer 32) consist of Te is specifically mentioned. The nano-inclusions of the second layer may be uniformly distributed in the second layer, and the nano-inclusions may be disposed between layers of the thermoelectric matrix. In another embodiment, the nano-inclusions may be randomly distributed in the second layer. In yet another embodiment, the nano-inclusions may be randomly or non-randomly distributed throughout the first and second layers. An embodiment wherein the first and second layers are alternately disposed (i.e., wherein the first and third layers are the same), and wherein the first layer consists of the thermoelectric matrix and the second layer consists of the nano-inclusions, is specifically mentioned.

In an embodiment the second layer may further comprise a thermoelectric matrix of Formula 1. The thermoelectric matrix of the second layer may also be independently selected. In an embodiment, the thermoelectric matrix of the first to third layers is the same. Another embodiment wherein the first and second layers are alternately disposed (i.e., wherein the first and third layers are the same), and wherein the first layer consists of the thermoelectric matrix and the second layer consists of the nano-inclusions and the thermoelectric matrix, is also mentioned.

Also, as further disclosed above, a total of a thickness of a single layer of the thermoelectric matrix, e.g., the first layer or the third layer, and a thickness of a single layer of the nano-inclusions, e.g., the second layer, may be in a range of about 4 nm to about 50 nm, specifically about 6 nm to about 45 nm, more specifically about 8 nm to about 40 nm. In an embodiment the thermoelectric material may be a thin film material. The thermoelectric material may further comprise a substrate, such as substrate 35 as shown in FIG. 3. A MgO (100) substrate is specifically mentioned.

Hereinafter, a method of fabricating a thermoelectric material comprising the nano-inclusions will be further disclosed.

A thermoelectric matrix material may be combined with (e.g., mixed with) a nano-inclusion material, and the combination processed by high energy milling for about 0.1 hour to about 100 hours, specifically about 0.5 hour to about 80 hours, more specifically about 1 hour to about 60 hours, to fabricate a thermoelectric material wherein the nano-inclusions are inserted into the thermoelectric matrix at a suitably high density. Continuous particle fracture and mixing may occur due to the high energy milling, and thus nano-inclusions and nano-sized particles of the thermoelectric matrix may be fabricated. The nano-inclusion material and the thermoelectric matrix may be fabricated by a general high-temperature sintering or a Spark Plasma Sintering method.

Alternatively, the thermoelectric material may be fabricated by combining (e.g., mixing) the thermoelectric matrix and the inclusions in a melting bath at a high temperature (e.g., about 600° C. to about 1200° C., specifically about 700° C. to about 1100° C.) and rapidly cooling them to form a phase of nano-inclusions in the thermoelectric matrix. Nano-inclusions having a selected concentration in a thermoelectric matrix material may be fabricated by combining (e.g., mixing) the nano-inclusions in an amount greater than the selected concentration and cooling the combination to form the nano-inclusions. A method using a solvent or a Melt Spinning Method may be used as a rapid cooling method.

The nano-inclusions may have a size of about 50 nanometers, specifically about 1 to about 40 nanometers, more specifically of about 10 nm to about 30 nm. For example, the nano-inclusions may have an average distance between adjacent particles of about 100 nm or less, for example, an average distance of about 10 nm to about 80 nm, specifically about 15 nm to about 70 nm, more specifically about 20 nm to about 60 nm.

Hereinafter, disclosed is an embodiment of a method of fabricating a thin film thermoelectric material in which the nano-inclusions are inserted.

A commercially available thermoelectric matrix having a composition of the Formula 1 is deposited on a substrate to form a layer of the thermoelectric matrix having a predetermined thickness. The layer of the thermoelectric matrix may be disposed using target, e.g. a sputtering target, comprising the thermoelectric matrix. Next a nano-inclusion target is used to form a layer comprising the nano-inclusion material having a predetermined thickness on the layer of the thermoelectric matrix, and the process is repeated to provide a second layer of the thermoelectric matrix on the nano-inclusion material to insert the nano-inclusions into the thermoelectric matrix.

The deposition method may include, for example, sputtering, atomic layer deposition, or physical vapor deposition.

According to another aspect, provided is a thermoelectric device obtained by molding a thermoelectric material, into which the nano-inclusions are inserted, using a method such as a cutting process.

The thermoelectric device may be a p-type thermoelectric device or an n-type thermoelectric device. The shape of the thermoelectric device is not limited and can be, for example, a rectangular or other rectilinear shape.

The thermoelectric device may be coupled with an electrode to provide a cooling effect when electrical current is applied, and may be a component which provides power generation in a device based on a difference in temperature.

Figure 4:
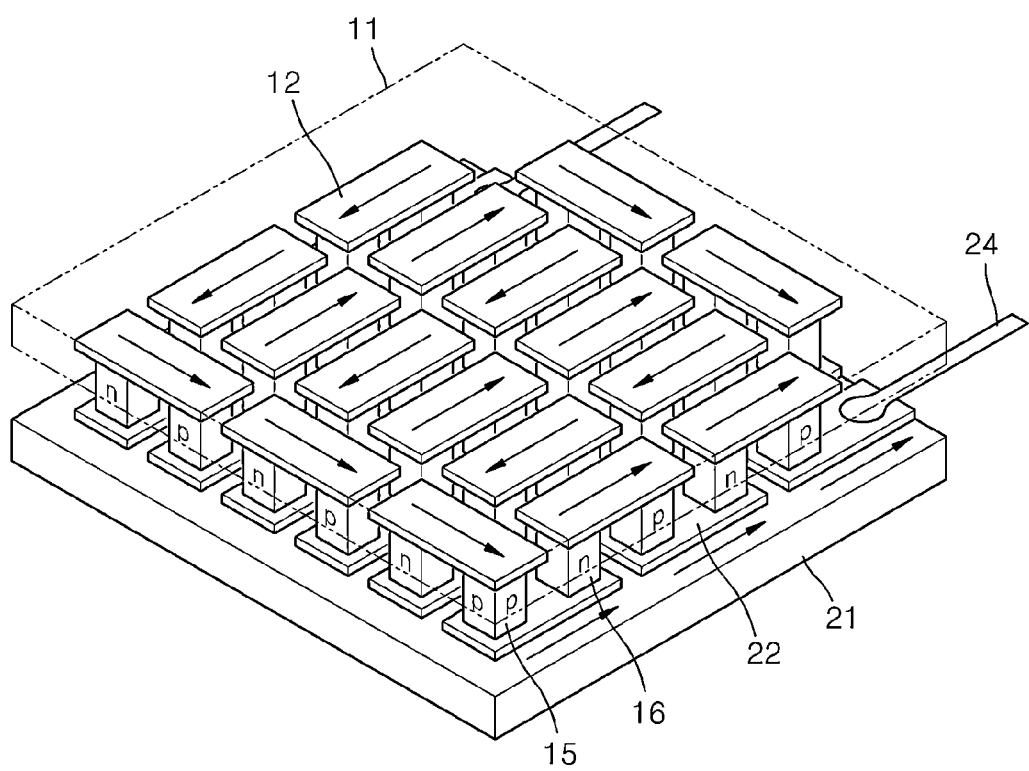
FIG. 4 shows an embodiment of a thermoelectric module.

FIG. 4 shows an example of a thermoelectric module in which the thermoelectric device is employed. As shown in FIG. 4, an upper electrode 12 and a lower electrode 22 are patterned and disposed (e.g., formed) on upper insulating substrate 11 and lower insulating substrate 21, and p-type thermoelectric component 15 and n-type thermoelectric component 16 contact the upper electrode 12 and lower electrode 22 to each other. These upper and lower electrodes 12 and 22 are connected to the outside of the device by lead electrodes 24.

The upper and lower insulating substrates 11 and 21 may each individually comprise gallium arsenide (GaAs), sapphire, silicon, PYREX, quartz, or a combination thereof. The upper and lower electrodes 12 and 22 may comprise a material such as aluminum, nickel, gold, or titanium, for example. The size of the upper and lower electrodes 12 and 22 may also be variously selected. Conventional patterning methods may be used as a method of patterning the upper and lower electrodes 12 and 22 without any limitations, and the lift-off semiconductor process, a deposition method, or a photolithography method, may be used, for example.

Figure 2:
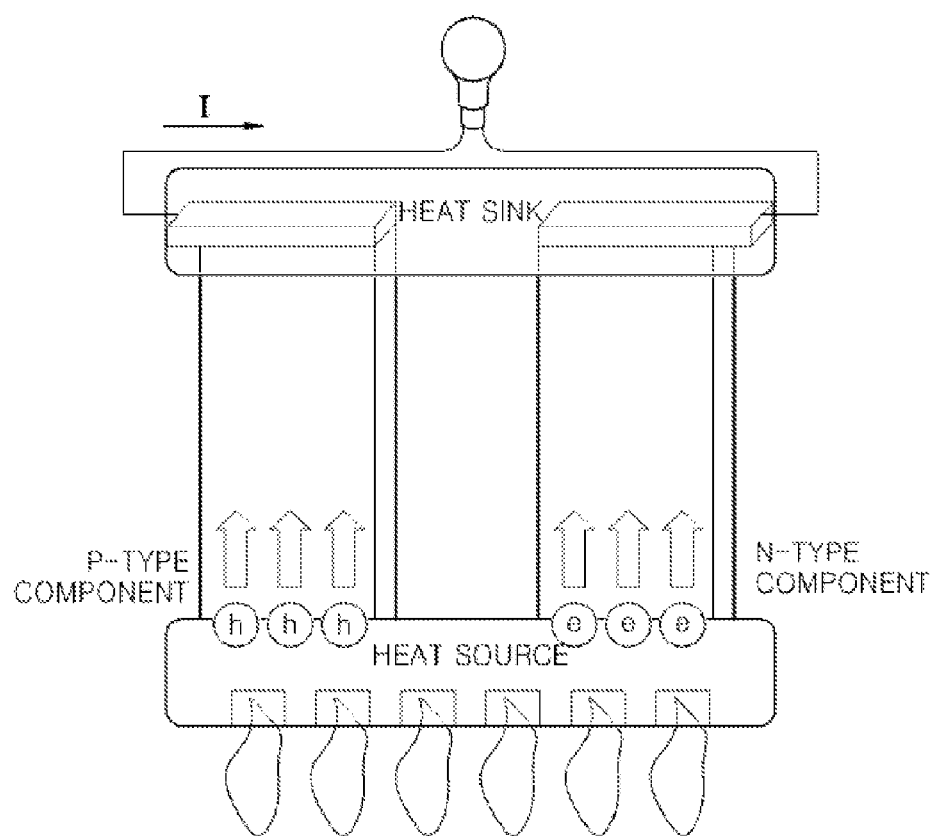
FIG. 2 is a schematic view illustrating thermoelectric power generation by a Seebeck effect.

As shown in FIGS. 1 and 2, a thermoelectric module can have various configurations. The thermoelectric module 10 may include a first electrode 1, a second electrode 2, and a thermoelectric material 3 included between the first electrode and the second electrode, wherein the thermoelectric material includes a thermoelectric material according to Formula 1. The thermoelectric module may further include an insulating substrate on which at least one of the first electrode and second electrode is disposed. An insulating substrate as described above may be used as the insulating substrate.

In an embodiment of the thermoelectric module, one of the first electrode and the second electrode may be exposed to a heat source as described in FIGS. 1 and 2. In an embodiment of the thermoelectric module, one of the first electrode and the second electrode may be electrically connected to a power supply as described in FIG. 1, or electrically connected to the outside of a thermoelectric module, for example, to an electric device which consumes or stores electric power, such as a battery, for example.

In an embodiment of the thermoelectric module, one of the first electrode and the second electrode may be electrically connected to a power supply.

In an embodiment of the thermoelectric module, the p-type thermoelectric device and the n-type thermoelectric device may be alternately arranged as shown in FIG. 4, and at least one of the p-type thermoelectric device and the n-type thermoelectric device may include a thermoelectric material into which the nano-inclusions are inserted.

Although embodiments of this disclosure are described in more detail with reference to the following Example, this disclosure shall not limited thereto.

EXAMPLES 1 TO 4

Multi-Target Pulsed Laser Deposition ("MTPLD"), which is a type of physical vapor deposition, was used to prepare a thermoelectric material into which nano-inclusions are inserted. A MgO substrate having the dimensions 10 millimeters (mm)×5 mm×0.5 mm of MgO 100 was used as a substrate. The target for deposition of the thermoelectric material had a composition of $Bi_{0.5}Sb_{1.5}Te_3$. A Te target was used for deposition of nano-inclusions. The MTPLD was performed using a 2 joule per square centimeter (J/cm) of KrF 248 nm Excimer Laser at 125° C. and 200 milliTorr (mTorr) of argon partial pressure. Annealing was performed at 225° C. for 2 hours.

The total thickness of the each of the thermoelectric materials of Examples 1 to 4 was about 500 nm. Each of the thermoelectric materials of Examples 1 to 4 included $Bi_{0.5}Sb_{1.5}Te_3$ ("BST") and Te, and a total amount of Te in Examples 1, 2, 3, and 4 was about 2.5 volume percent (vol %), about 5 vol %, 7.5 vol %, and 15 vol %, respectively.

In Example 1, which included 2.5 vol % Te, 20 nm thick layers of BST and Te nano-inclusion layers were alternately deposited 25 times. In Example 2, 10 nm thick layers of BST and Te nano-inclusion layers were alternately deposited 50 times. In Example 3, 6.7 nm thick layers of BST and Te nano-inclusion layers were alternately deposited 75 times. In Example 4, 3.3 nm thick layers of BST and Te nano-inclusion layers were alternately deposited 150 times.

The Te nano-inclusion layers were fabricated by irradiating the Te target with six (6) 2 $J/cm^2$ pulses from a KrF 248 nm Excimer Laser to provide Te nano-inclusions with a particle diameter of about 10 nm to about 20 nm and an average particle diameter of about 15 nm. The Te nano-inclusions were formed at a mesh density of about 300 particles per square micrometer ($ea/\mu m^2$). Each Te nano-inclusion layer is deposited at a volume ratio corresponding to a film with a thickness of about 0.5 nm.

Figure 5A:
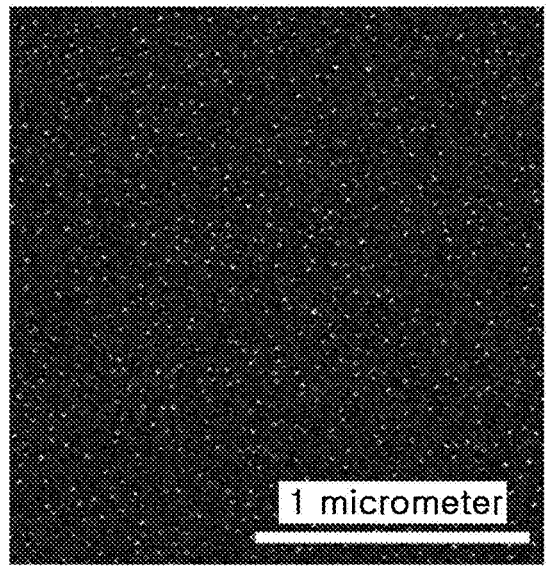
FIG. 5A is an scanning electron micrograph ("SEM") of a surface of a thermoelectric material obtained in Example 1, the surface including nano-inclusions.
Figure 5B:
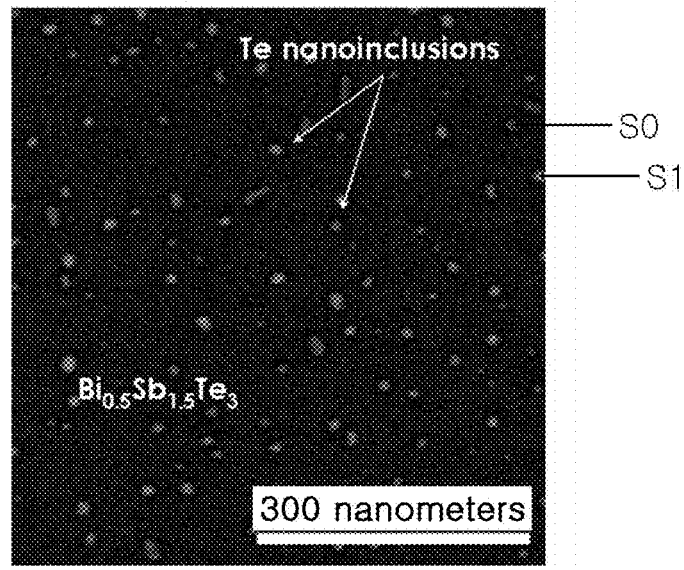
FIG. 5B is an enlarged SEM of the surface of the thermoelectric material obtained in Example 1.
Figure 5C:
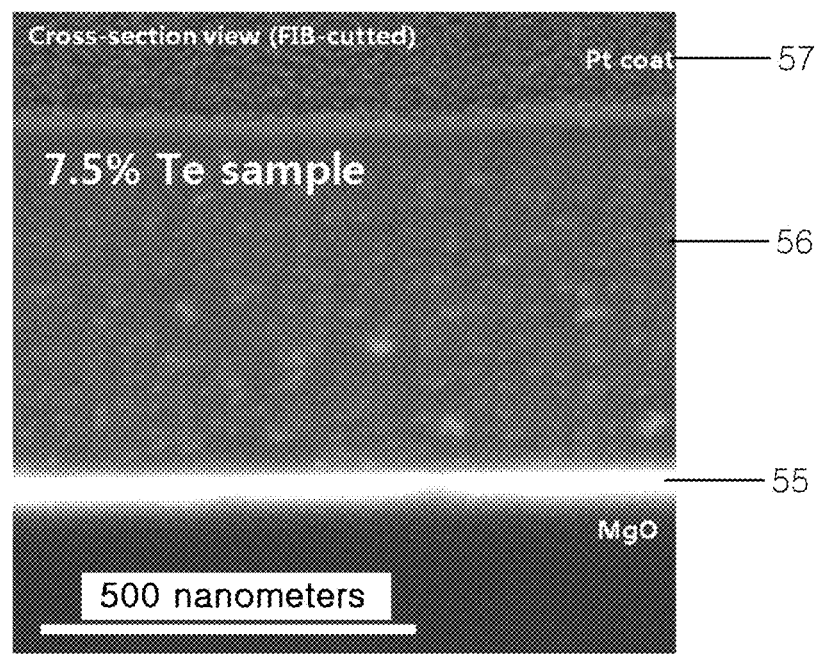
FIG. 5C is an SEM of a cross-section of the thermoelectric material obtained in Example 1.

FIGS. 5A and 5B respectively show scanning electron micrographs ("SEM"s) of a substantially flat surface of the thermoelectric material of Example 1, which included the thermoelectric matrix $Bi_{0.5}Sb_{1.5}Te_3$ 50 and Te particles 51, in which the Te particles were included at a surface density of about 300 $ea/\mu m^2$. The density of the Te particles was about 2,400 $ea/\mu m^3$ to about 14,000 $ea/\mu m^3$, and the average distance between adjacent Te particles may be measured to be about 20 nm to about 40 nm. A cross-sectional view of the thermoelectric material obtained in Example 3 is shown in FIG. 5C. Shown in FIG. 5C is a MgO substrate 55, the thermoelectric material 56, which included the BST thermoelectric matrix and 7.5 vol % Te, and a Pt coating 57. The cross-section shown in FIG. 5C was prepared by focused ion beam ("FIB") cutting. In FIG. 5C it can be seen that Te nano-inclusion layers are formed on a BST layer. Also, it can be seen that a unit structure including the BST layer and Te nano-inclusions has a total thickness of about 540 nm.

COMPARATIVE EXAMPLE 1

BST into which Te was not inserted was prepared as Comparative Example 1 at a thickness of about 500 nm.

The compositions in Examples 1 to 4 and Comparative Example 1 are summarized as follows.

TABLE 1

| Material | Volume content of Te | Composition | Total thickness |
|---|---|---|---|
| Comparative Example 1 | 0% | 500 nm $Bi_{0.5}Sb_{1.5}Te_3$ ("BST") | 500 nm |
| Example 1 | 2.5% | (20 nm BST/Te layer) × 25 | 513 nm |
| Example 2 | 5% | (10 nm BST/Te layer) × 50 | 525 nm |
| Example 3 | 7.5% | (6.7 nm BST/Te layer) × 75 | 538 nm |
| Example 4 | 15% | (3.3 nm BST/Te layer) × 150 | 575 nm |

EXPERIMENTAL EXAMPLE 1

Seebeck coefficients and electrical conductivities of the thermoelectric materials prepared in Examples 1 to 4 and Comparative Example 1 were measured using a ZEM-3 from ULVAC-RIKO, Inc. (Japan), and a power factor was calculated based on a result of the measurement of the Seebeck coefficients and the electrical conductivities of the thermoelectric materials. The results are shown in FIGS. 6A, 6B, 7A, 7B, 8A, and 8B.

Figure 6A:
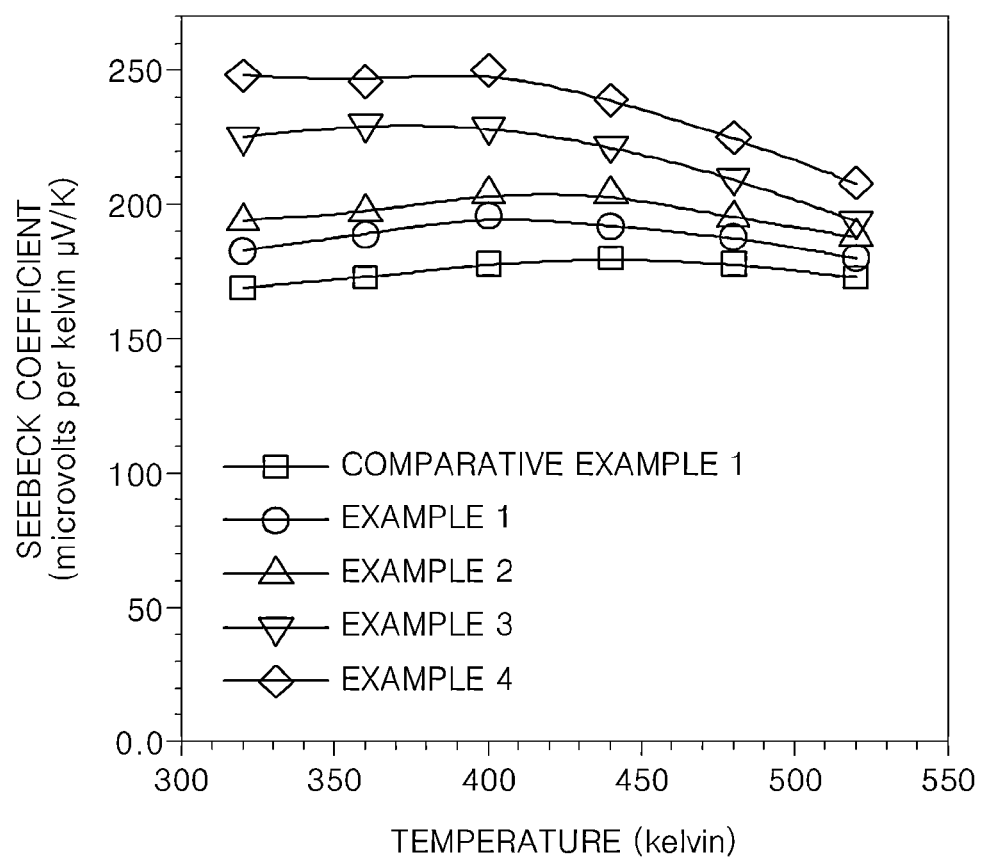
FIG. 6A is a graph of Seebeck coefficient (microvolts per Kelvin, μV/K) versus temperature (Kelvin, K) showing results for the thermoelectric materials obtained in Examples 1 to 4, which included nano-inclusions, and Comparative Example 1.
Figure 6B:
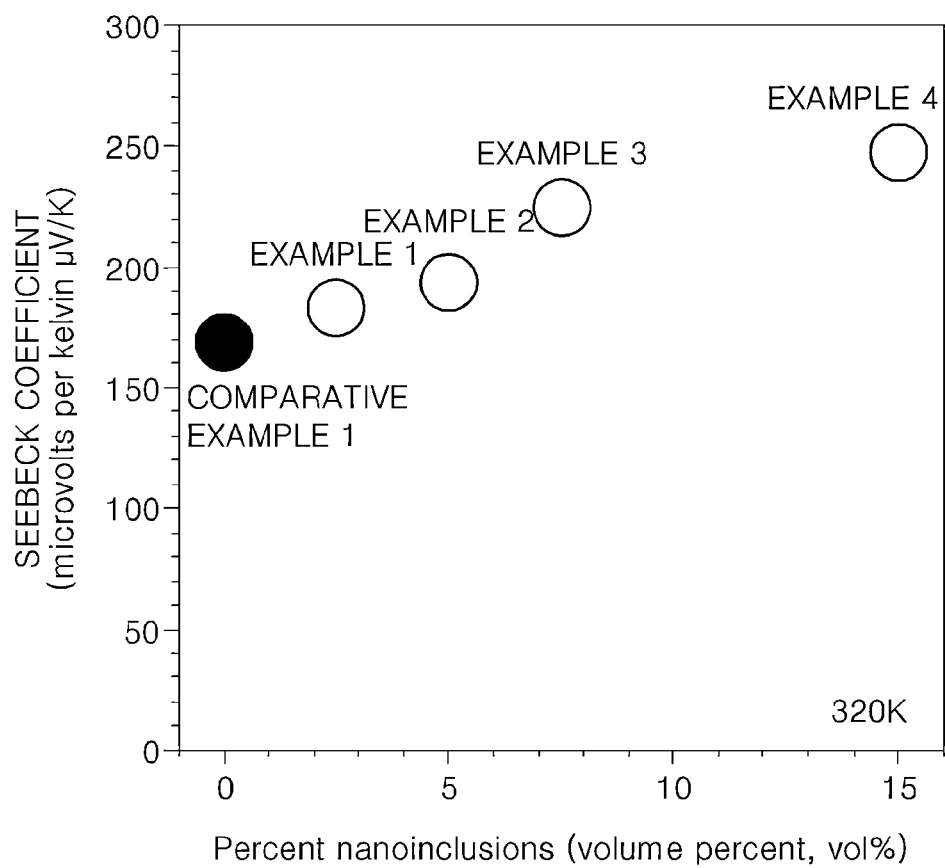
FIG. 6B is a graph of Seebeck coefficient (microvolts per Kelvin, μV/K) versus percent nano-inclusions (volume percent, Vol %) showing results the thermoelectric materials obtained in Examples 1 to 4, which included nano-inclusions, and Comparative Example 1.

As shown in FIG. 6A, Seebeck coefficients in the materials of Examples 1 to 4, which include Te nano-inclusions, were increased by about 9% to about 45% as compared to the Seebeck coefficient of the material of Comparative Example 1 (based on 320K data). Also, as shown in FIG. 6B, the Seebeck coefficients of the materials of Examples 1 to 4, which include Te nano-inclusions, were increased as the amount of nano-inclusions increased.

Figure 7A:
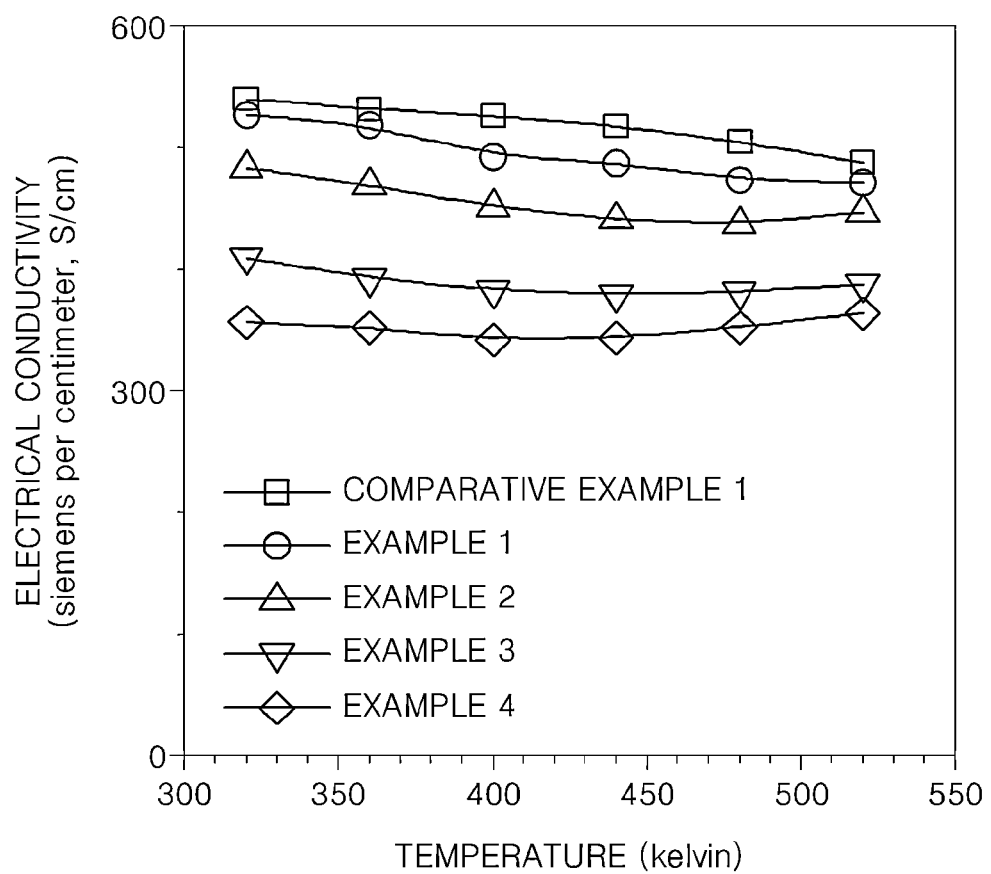
FIG. 7A is a graph of electrical conductivity (Siemens per centimeter, S/cm) versus temperature (Kelvin, K) showing results for the thermoelectric materials obtained in Examples 1 to 4, which included nano-inclusions, and Comparative Example 1.
Figure 7B:
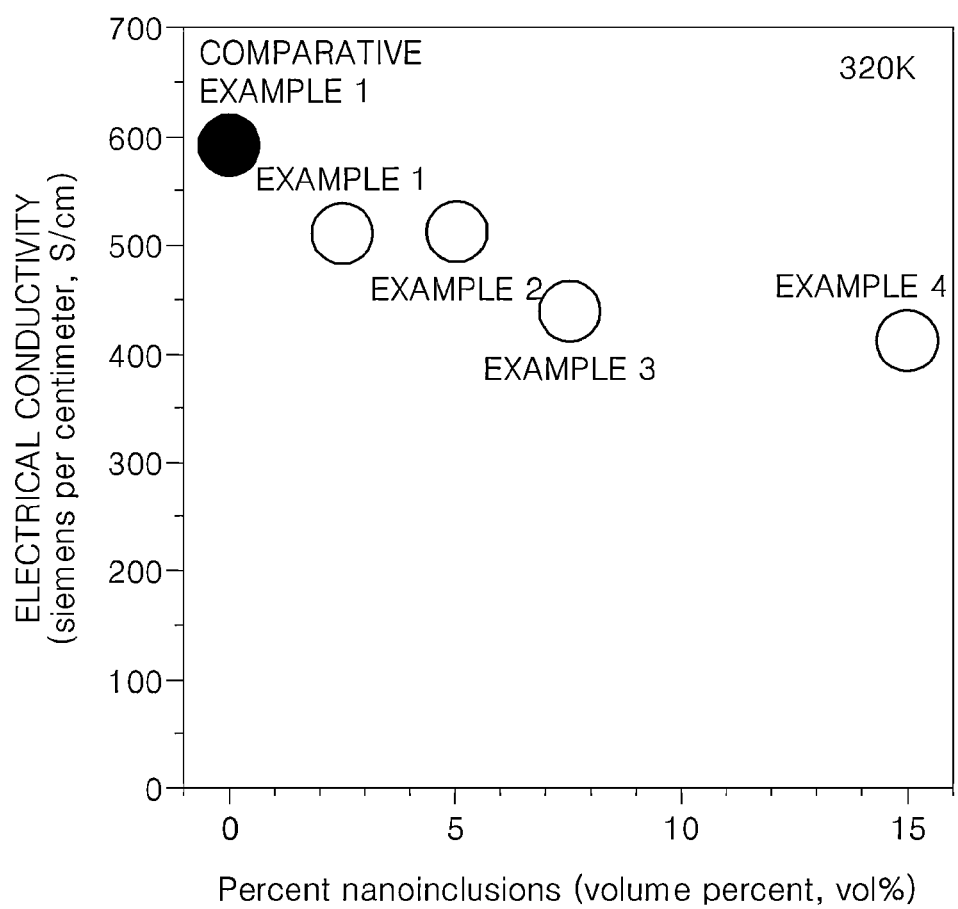
FIG. 7B is a graph of electrical conductivity (Siemens per centimeter, S/cm) versus percent nano-inclusions (volume percent, Vol %) showing results the thermoelectric materials obtained in Examples 1 to 4, which included nano-inclusions, and Comparative Example 1.
Figure 8A:
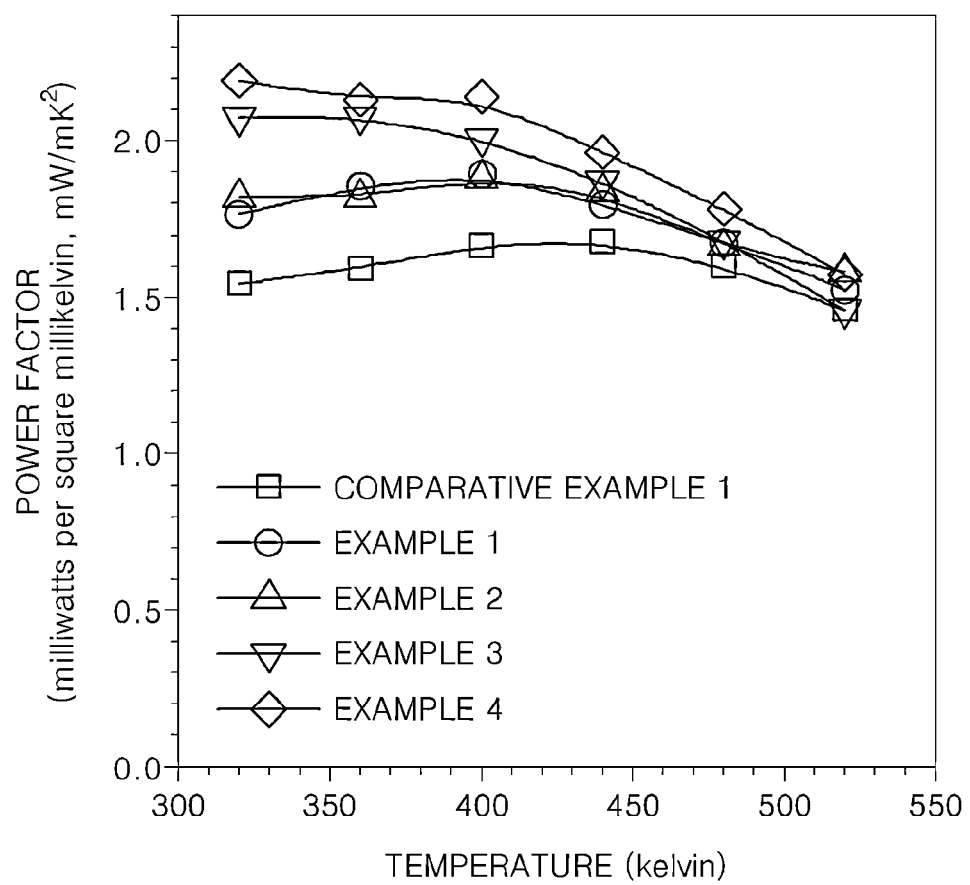
FIG. 8A is a graph of power factor (milliWatts per square milliKelvin, $mW/mK^2$) versus temperature (Kelvin, K) showing results for the thermoelectric materials obtained in Examples 1 to 4 and Comparative Example 1.
Figure 8B:
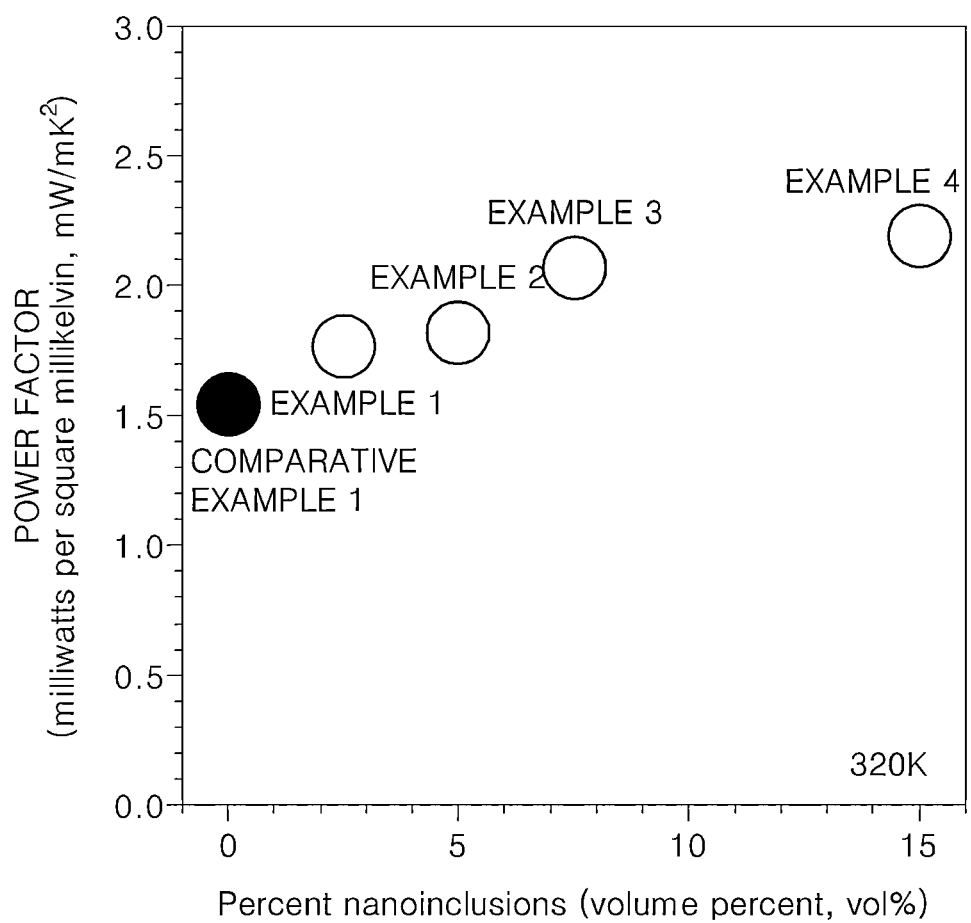
FIG. 8B is a graph of power factor (milliWatts per square milliKelvin, $mW/mK^2$) versus percent nano-inclusions (volume percent, Vol %) showing results the thermoelectric materials obtained in Examples 1 to 4, which included nano-inclusions, and Comparative Example 1.

As shown in FIG. 7A, the electrical conductivity of the materials of Examples 1 to 4 tends to decreased by about 2% to about 35% (based on 320K data) as compared to that of the material of Comparative Example 1. Also, as shown in FIG. 7B, the electrical conductivities of the materials were decreased as the nano-inclusions contents were increased. These results show that the increase in the Seebeck coefficient was more than the decrease in the electrical conductivity, and the power factor was increased by about 13% to about 50% as shown in FIG. 8A. Also, as shown in FIG. 8*b*, the power factor increased as the content of nano-inclusions increased.

Also, with respect to determining ZT and with reference to Mathematical Formula 1, the increase is provided in the Seebeck coefficient, which is a squared term, and thus a greater increase of the power factor is provided.

Figure 9:
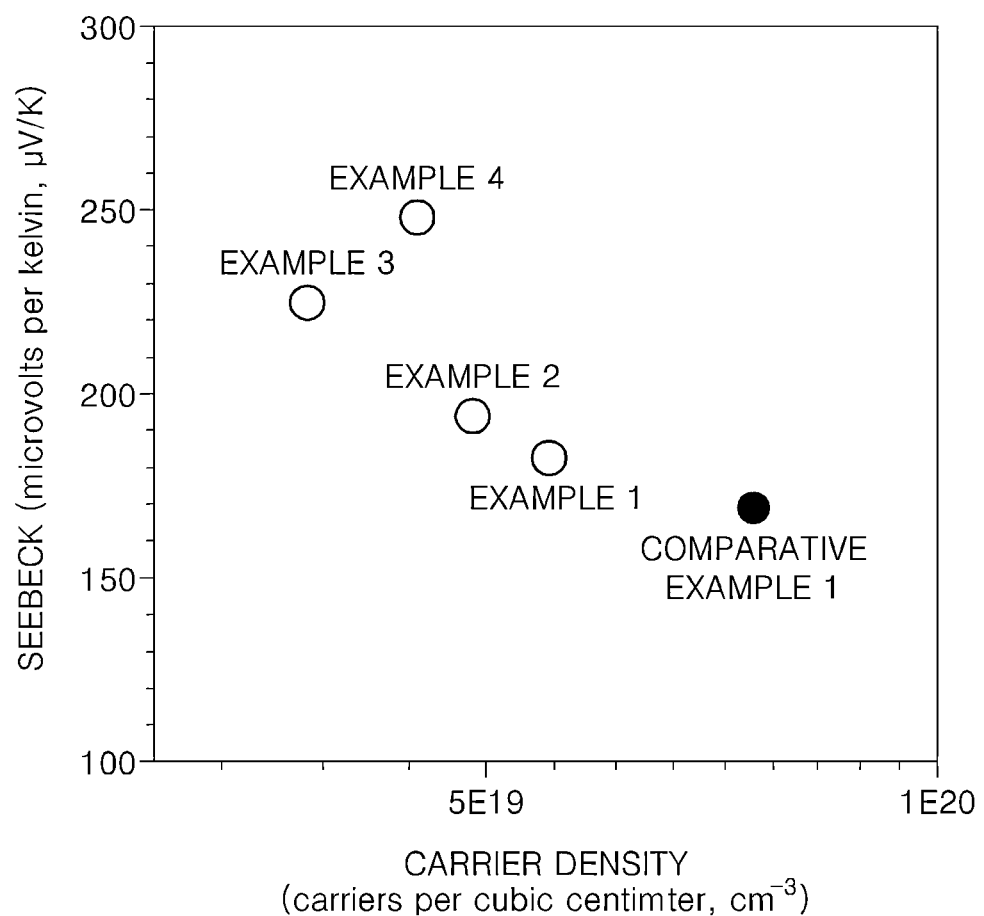
FIG. 9 is a graph of Seebeck coefficient (microvolts per Kelvin, μV/K) versus carrier concentration (carriers per cubic centimeter, $cm^{-3}$) for the thermoelectric materials obtained in Examples 1 to 4, which included nano-inclusions, and Comparative Example 1.

With regard to the thermoelectric materials of Examples 1 to 4 and Comparative Example 1, FIG. 9 shows Seebeck coefficients versus carrier concentration at room temperature. Hall measurements were performed using a Lakeshore HMS7600 Series instrument, and as shown in FIG. 9, the Seebeck coefficients of the thermoelectric materials obtained in Examples 1 to 4 increased as Te content increased. While not wanting to be bound by theory, it is understood that adding of the Te nano-inclusions caused a decrease in the carrier concentration, it can be seen that the thermoelectric materials of Examples 1 to 4 have increased Seebeck coefficients when compared to a thermoelectric material of Comparative Example 1, which did not include Te nano-inclusions.

Also, an additional increase in the Seebeck coefficient and the decreased carrier concentration may be caused by a carrier energy filtering effect expected at an energy-dependent electron scattering time according to adding of Te particles.

As is further disclosed above, a thermoelectric material including Te nano-inclusions may be formed by alternate deposition of a BST layer and a Te particle layer. While not wanting to be bound by theory, it is understood that the Te particles inserted into the BST thermoelectric matrix play an important role in creating a carrier energy filtering effect. In a thermoelectric material including Te nano-inclusions, an increase of a Seebeck coefficient is greater than a decrease of an electrical conductivity, and consequently, an increase in a power factor is provided. The increased power factor directly results in an increase in ZT.

According to an embodiment, a thermoelectric material may provide an improved thermoelectric conversion efficiency and an improved Seebeck coefficient. A thermoelectric module and a thermoelectric device including the thermoelectric material may be used in a variety of cooling devices, such as a refrigerant-free refrigerator or a refrigerant-free air-conditioner, waste heat power generation, thermoelectric nuclear power generation for the military or aerospace applications, micro-cooling systems, and the like.

It shall be understood that the exemplary embodiments described herein shall be considered in a descriptive sense only and not for purposes of limitation. Descriptions of features, advantages, or aspects of each embodiment shall be considered as available for other similar features, advantages, or aspects of other embodiments.

What is claimed is:

1. A thermoelectric material comprising:
a thermoelectric matrix; and
nano-inclusions in the thermoelectric matrix, the nano-inclusions having an average particle diameter of about 10 nanometers to about 30 nanometers and a work function in a range of about 3.8 electron volts to about 5.1 electron volts,
wherein the nano-inclusions are contained in an amount of about 7.5 volume percent to about 15 volume percent, based on the total volume of the thermoelectric material,
wherein the thermoelectric matrix has a composition of Formula 1:

$$A_xB_y \qquad \text{Formula 1}$$

wherein A is at least one of Bi and Sb, B is at least one of Te and Se, x is a number in a range of more than 0 and less than or equal to about 2, and y is a number in a range of more than 0 and less than or equal to about 3, and wherein the thermoelectric matrix and the nano-inclusions are in a form of alternating layers wherein a total thickness of a single-layer of the thermoelectric matrix and a single-layer of the nano-inclusions is in a range of about 4 nanometers to about 50 nanometers.

2. The thermoelectric material of claim 1, wherein the nano-inclusions comprise at least one of Te, Sb, Fe, Mo, Au, Ag, and Cu.

3. The thermoelectric material of claim 1, wherein an average distance between adjacent nano-inclusions of the nano-inclusions is in a range of about 10 nanometers to about 80 nanometers.

4. The thermoelectric material of claim 1, wherein the nano-inclusions are included in the thermoelectric matrix at a density of about 2,400 nano-inclusions per cubic micrometer to about 24,000 nano-inclusions per cubic micrometer.

5. A thermoelectric device comprising the thermoelectric material of claim 1.

6. A thermoelectric module, comprising:
a first electrode;
a second electrode; and
the thermoelectric device of claim 5 disposed between the first electrode and the second electrode.

7. A thermoelectric thin film material, comprising:
a first layer comprising a first thermoelectric matrix;
a third layer, the third layer comprising a second thermoelectric matrix; and
nano-inclusions having an average particle diameter in a range of about 10 nanometers to about 30 nanometers and a work function in a range of about 3.8 electron volts to about 5.1 electron volts,
wherein the nano-inclusions are disposed in an interface between and directly contact the first layer and the third layer,
wherein the first thermoelectric matrix and the second thermoelectric matrix each independently have a composition of Formula 1:

$$A_xB_y \qquad \text{Formula 1}$$

wherein A is at least one of Bi and Sb, B is at least one of Te and Se, x is a number in a range of more than 0 and less or equal to than 2, and y is a number in a range of more than 0 and less than or equal to 3, and
wherein a total thickness of a single-layer of the first layer and a single-layer of the nano-inclusions is in a range of about 4 nanometers to about 50 nanometers.

8. The thermoelectric thin film material of claim 7, wherein the first thermoelectric matrix is the same as the second thermoelectric matrix.

9. The thermoelectric thin film material of claim 7, wherein a surface density of the nano-inclusions is in a range of about 40 nano-inclusions per square micrometer to about 500 nano-inclusions per square micrometer.

10. A thermoelectric device comprising the thermoelectric thin film material of claim 7.

11. A thermoelectric module, comprising:
a first electrode;
a second electrode; and
the thermoelectric device of claim 10 disposed between the first electrode and the second electrode.

* * * * *